United States Patent
Sutardja

(10) Patent No.: US 8,525,317 B1
(45) Date of Patent: *Sep. 3, 2013

(54) INTEGRATED CHIP PACKAGE HAVING INTERMEDIATE SUBSTRATE WITH CAPACITOR

(75) Inventor: Sehat Sutardja, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 705 days.

This patent is subject to a terminal disclaimer.

(21) Appl. No.: 11/133,358

(22) Filed: May 20, 2005

Related U.S. Application Data

(60) Continuation of application No. 10/346,771, filed on Jan. 16, 2003, now Pat. No. 6,911,724, which is a division of application No. 09/966,914, filed on Sep. 27, 2001, now Pat. No. 6,979,894.

(51) Int. Cl.
*H01L 23/02* (2006.01)

(52) U.S. Cl.
USPC ........... 257/686; 257/685; 257/717; 257/720; 257/723; 438/109

(58) Field of Classification Search
USPC ................. 257/685–686, 717, 720, 723–725, 257/777–778
See application file for complete search history.

(56) References Cited

U.S. PATENT DOCUMENTS

| | | | |
|---|---|---|---|
| 4,517,584 A | 5/1985 | Matsushita et al. | |
| 4,965,660 A | 10/1990 | Ogihara et al. | |
| 5,075,248 A * | 12/1991 | Yoon et al. | 438/244 |
| 5,168,126 A | 12/1992 | Matsumoto et al. | |
| 5,204,809 A | 4/1993 | Andresen | |
| 5,291,064 A * | 3/1994 | Kurokawa | 257/714 |
| 5,311,402 A | 5/1994 | Kobayashi et al. | |
| 5,355,283 A | 10/1994 | Marrs et al. | |
| 5,424,573 A * | 6/1995 | Kato et al. | 257/431 |
| 5,495,398 A | 2/1996 | Takiar et al. | |
| 5,550,408 A | 8/1996 | Kunitomo et al. | |
| 5,646,828 A * | 7/1997 | Degani et al. | 361/715 |
| 5,710,459 A | 1/1998 | Teng et al. | |
| 5,729,050 A | 3/1998 | Kim | |

(Continued)

FOREIGN PATENT DOCUMENTS

| | | |
|---|---|---|
| DE | 19821916 | 3/1999 |
| JP | 60-154648 | 8/1985 |

(Continued)

OTHER PUBLICATIONS

Amkor Technology, www.amkor.com, Advanced package glossary, pp. 104, Mar. 2001.

(Continued)

*Primary Examiner* — Theresa T Doan

(57) ABSTRACT

An integrated chip package includes at least one semiconductor chip. The at least one semiconductor chip includes a first surface and a second surface. The integrated chip package includes an intermediate substrate. The intermediate substrate is electrically coupled via conductive bumps to the first surface of the at least one semiconductor chip. The intermediate substrate includes at least one capacitor electrically coupled to the at least one semiconductor chip. The at least one capacitor includes a trench capacitor. The integrated chip package includes a package substrate. The package substrate includes a first surface electrically coupled to the intermediate substrate via a plurality of bonding wires.

21 Claims, 4 Drawing Sheets

(56) References Cited

U.S. PATENT DOCUMENTS

| | | | |
|---|---|---|---|
| 5,729,440 A | 3/1998 | Jimarez et al. | |
| 5,866,943 A | 2/1999 | Mertol | |
| 5,869,894 A | 2/1999 | Degani et al. | |
| 5,959,348 A | 9/1999 | Chang et al. | |
| 5,977,640 A * | 11/1999 | Bertin et al. | 257/777 |
| 6,020,646 A | 2/2000 | Boyle et al. | |
| 6,052,287 A | 4/2000 | Palmer et al. | |
| 6,069,023 A | 5/2000 | Bernier et al. | |
| 6,096,981 A | 8/2000 | Vinciarelli et al. | |
| 6,098,278 A | 8/2000 | Vindasius et al. | |
| 6,111,313 A | 8/2000 | Kutlu | |
| 6,117,797 A | 9/2000 | Hembree | |
| 6,124,636 A * | 9/2000 | Kusamitsu | 257/728 |
| 6,150,724 A | 11/2000 | Wenzel et al. | |
| 6,175,158 B1 | 1/2001 | Degani et al. | |
| 6,232,661 B1 | 5/2001 | Amagai et al. | |
| 6,242,815 B1 | 6/2001 | Hsu et al. | |
| 6,265,771 B1 * | 7/2001 | Ference et al. | 257/706 |
| 6,271,079 B1 | 8/2001 | Wei et al. | |
| 6,274,214 B1 | 8/2001 | Chan et al. | |
| 6,282,100 B1 | 8/2001 | Degani et al. | |
| 6,346,743 B1 * | 2/2002 | Figueroa et al. | 257/723 |
| 6,362,986 B1 | 3/2002 | Schultz et al. | |
| 6,388,207 B1 | 5/2002 | Figueroa et al. | |
| 6,418,615 B1 * | 7/2002 | Rokugawa et al. | 29/852 |
| 6,421,473 B1 | 7/2002 | Paniccia et al. | |
| 6,424,033 B1 | 7/2002 | Akram | |
| 6,507,107 B2 | 1/2003 | Vaiyapuri | |
| 6,507,115 B1 | 1/2003 | Hofstee | |
| 6,525,414 B2 | 2/2003 | Shiraishi et al. | |
| 6,535,398 B1 | 3/2003 | Moresco | |
| 6,734,552 B2 | 5/2004 | Combs et al. | |
| 6,822,433 B1 * | 11/2004 | Gilbert | 324/76.77 |
| 6,849,940 B1 | 2/2005 | Chan et al. | |
| 6,911,724 B1 * | 6/2005 | Sutardja | 257/686 |
| 6,979,894 B1 | 12/2005 | Sutardja | |
| 6,995,463 B1 * | 2/2006 | Sutardja | 257/686 |
| 7,071,574 B1 * | 7/2006 | Nojiri et al. | 257/784 |
| 2001/0003375 A1 | 6/2001 | Kovats et al. | |
| 2002/0071256 A1 | 6/2002 | Figueroa et al. | |
| 2002/0175421 A1 | 11/2002 | Kimura | |
| 2002/0195270 A1 | 12/2002 | Okubora et al. | |
| 2002/0195700 A1 | 12/2002 | Li | |
| 2002/0196898 A1 | 12/2002 | Kameshima | |
| 2003/0016133 A1 | 1/2003 | Egbert | |
| 2003/0021568 A1 | 1/2003 | Samara-Rubio et al. | |
| 2003/0042589 A1 | 3/2003 | Hong | |
| 2003/0080400 A1 | 5/2003 | Okamoto et al. | |
| 2004/0169272 A1 | 9/2004 | Hembree | |

FOREIGN PATENT DOCUMENTS

| | | |
|---|---|---|
| JP | 62-281435 | 12/1987 |
| JP | 1-248543 | 10/1989 |
| JP | 08-250652 | 2/1996 |
| JP | 2001-102475 | 4/2001 |

OTHER PUBLICATIONS

Bober, et al., "Current Trends in Flip-Chip Bonding Technique for Multichip Modules—especially Micro-Jet Printing," Inst. of Microsystem Tech., Wroclaw U. of Tech., Wroclaw, Poland, Conference 2000, pp. 1014, via iMaps.

Semiconductor Glossary, Trench Cap Definition, http://semiconductorglossary.com, Feb. 5, 2004.

IC Packaging Catalog, 2001, Advanced Semiconductor Engineering, Inc., pp. 61, 67, 70 and 84.

* cited by examiner

INTEGRATED CHIP PACKAGE HAVING INTERMEDIATE SUBSTRATE WITH CAPACITOR

This application is a continuation of U.S. patent application Ser. No. 10/346,771, filed Jan. 16, 2003, which is a divisional of U.S. patent application Ser. No. 09/966,914, filed Sep. 27, 2001, the entire contents of each which are hereby incorporated by reference herein.

BACKGROUND

1. Field of the Invention

The present invention relates to integrated circuit packaging, and more particularly to packaging of flip chip semiconductors.

2. Background Information

The drive to higher semiconductor device densities places increased demands on the packaging for these devices to remove heat generated from dissipated power in the device. One low cost packaging technique that has been used device having lower densities is plastic ball gate array (PBGA). In a PBGA thermal vias on the underside of the encapsulated die provide a thermal path for the thermal energy to the circuit board. Typically, a PBGA is limited to dissipating less than approximately 2.5 watts. The low power dissipation capability of a PBGA is quickly being exceeded by the power requirements of today's high density devices. In addition, routing the thermal energy into the circuit board limits the number of semiconductor devices that can be mounted on the circuit board.

Flip chip ball gate array (FCBGA) is a packaging technique that is capable of supporting semiconductor devices that dissipate more than 20 watts of power. In a FCBGA, the semiconductor device or integrated circuit chip is connected to a package substrate via solder balls. The package substrate is coupled to the circuit board through solder balls on the underside of the package. To connect the pads of the device or chip to the solder balls, the package substrate typically uses a build-up construction to permit the use of extremely fine pitch wiring for the interconnection. Although a FCBGA provides a packaging solution for high dissipation devices, the cost of a FCBGA is very high due to the need for a substrate having a build-up construction.

SUMMARY OF THE INVENTION

The present integrated chip package provides a low cost package that is suitable for high density semiconductors that have high power dissipation. The integrated chip package includes at least one semiconductor chip having a first surface and a second surface. The first surface of the semiconductor chip is electrically coupled to an intermediate substrate via conductive bumps. The intermediate substrate is also electrically coupled to a package substrate via a plurality of bonding wires. The second surface of the semiconductor chip is thermally coupled to a heat sink to increase the power dissipation capacity of the integrated chip package.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Figure 1:
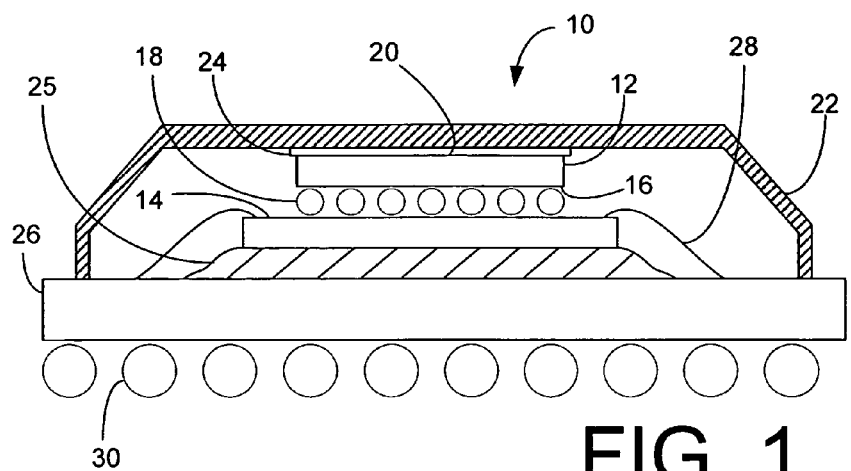
FIG. 1 shows a first embodiment of an integrated chip package in accordance with the principles of the invention.

Referring to FIG. 1, a first embodiment of an integrated chip package 10 in accordance with the principles of the invention is shown. The integrated chip package 10 is a modified FCBGA that can advantageously dissipate approximately the same amount of heat as a flip chip package at a much lower cost. In addition, the thermal path of the integrated chip package 10 extends away from the circuit board to reduce the heat load on the circuit board.

The integrated chip package 10 includes a semiconductor chip 12 configured for flip chip mounting that is attached to an intermediate substrate 14. A first surface 16 of the semiconductor chip 12 is electrically connected to the intermediate substrate 14 via conductive bumps 18. The conductive bumps 18 may be formed from any electrically conductive material such as Pb/Sn solder, Au, Ag, alloys of Au and Ag, and metallic coated polymeric studs. In addition, an epoxy 13 or other suitable material formed between the conductive bumps 18 may be used as an embedding material for the conductive bumps 18 to provide mechanical support and moisture protection. The semiconductor chip 12 may be attached to the intermediate substrate 14 using any flip chip compatible bonding method such as thermocompression, soldering, encapsulation, and adhesives.

The other surface 20 of the semiconductor chip 12 is attached to a heat sink 22 for coupling heat away from the semiconductor chip 12. The heat sink 22 may be made of any thermally conductive material such as copper and thermally conductive plastic. The semiconductor chip 12 may be attached to the heat sink 22 by any attachment item 24 that does not thermally isolate the semiconductor chip 12 such as adhesive, solder, and press-fitting by applying a mechanical force to the first surface of the semiconductor chip 12 or the intermediate substrate 14. For example, a thermally conductive epoxy may be used as the attachment item 24.

The intermediate substrate 14 is electrically connected to conductors on a package substrate 26 via several bonding wires 28. The intermediate substrate 14 converts flip chip mounting of the semiconductor chip 12 into wire bond mounting to combine and exceed the advantages of FCBGA and PBGA. Similar to FCBGA, the integrated chip package 10 provides a low resistance thermal path for heat generated in the semiconductor chip 12 so that power dissipation exceeding 20 watts may be accommodated. In addition, the thermal path of the integrated chip package 10 extends to the heat sink 22, away from the package substrate 26, thereby reducing the heat load of the circuit board or circuit substrate to which the integrated chip package 10 is connected. Also, the integrated chip package may employ a substrate that is as inexpensive as substrates used for PBGA packages. Additionally, using the intermediate substrate 14 reduces the wiring pitch requirements on bonding wire equipment used for attaching the bonding wires 28.

Figure 2:
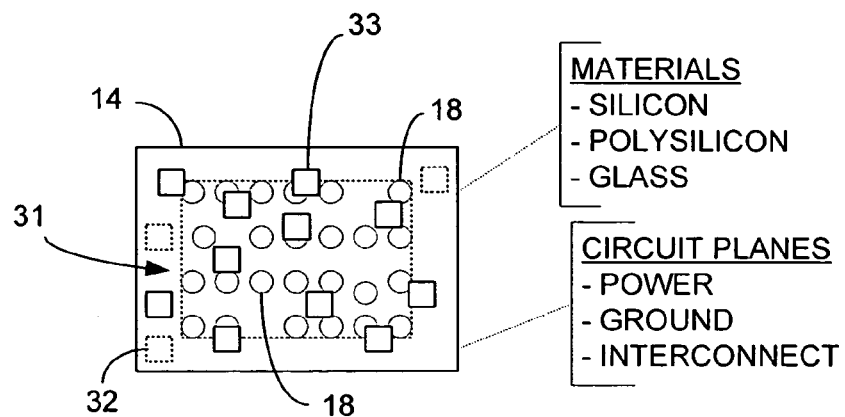
FIG. 2 shows a shows a second embodiment of an integrated chip package in accordance with the principles of the invention.

Referring to FIGS. 1 and 2, the intermediate substrate 14 may be made from any substrate material such as normal silicon wafer (either low or high quality), polysilicon, and glass. Circuit planes such as power planes, ground planes, and interconnect planes may be added to the intermediate substrate 14. The process technology used for the circuit planes is not limited to the technology used for the semiconductor chip 12. Instead, other process technologies including lower cost technologies such as 1 micron technology may be employed to reduce the cost of the package 10. The circuit planes may provide interconnect within the semiconductor chip 12 as well as to the package substrate 26 through the bonding wires 28. Including circuit planes in the intermediate substrate 14 may reduce the requirement for expensive power and ground grids on the semiconductor chip. For example at 0.13 μm, each layer of metalization costs about 10 times more than the cost of providing the same function on the intermediate substrate 14. Moreover, the semiconductor chip 12 may employ distributed power and ground conductive bumps to achieve substantially lower impedance. Decoupling capacitors 32 may be included on the intermediate substrate to provide local filtering of power and ground signals. Providing local filtering is particularly advantageous in view of the high DC and AC currents that may flow between the intermediate substrate 14 and the semiconductor chip 12. For example, in a 20 watt device operated with 1 volt supply voltage, the DC current is 20 amps with an AC current that may be 150 amps. In view of such high magnitude AC currents, providing local filtering with low inductance paths is crucial to maintain a relatively constant supply voltage. The decoupling capacitors 32 may include one or more small capacitors as well as a single large parallel plate capacitor 31 covering the whole substrate. The values of the capacitors may be controlled by varying the thickness and area of the dielectric. For example, the value of a parallel plate capacitor 31 may be controlled by varying the thickness of a layer of silicon between the metallized plates. Additional capacitor materials may be used that otherwise are generally not used in advanced wafer fabrication because of concerns with contaminating the wafer. Examples of capacitor materials include standard oxides and nitride oxides. In addition, trench capacitors 33 may be formed on the intermediate substrate 14. Trench capacitors advantageously provide higher volumetric efficiency than parallel plate capacitors. Practically one entire side of the intermediate substrate 14 may be used for decoupling capacitors 32, as well as portions of the other side of the intermediate substrate 14.

The package substrate 26 may be made of any substrate material suitable for ball grid array mounting to a device such as a circuit board or substrate. Additionally, a support layer 25 such as an epoxy or other suitable material may be inserted between the intermediate substrate 14 and the package 26 to provide addition mechanical support.

Figure 3A:
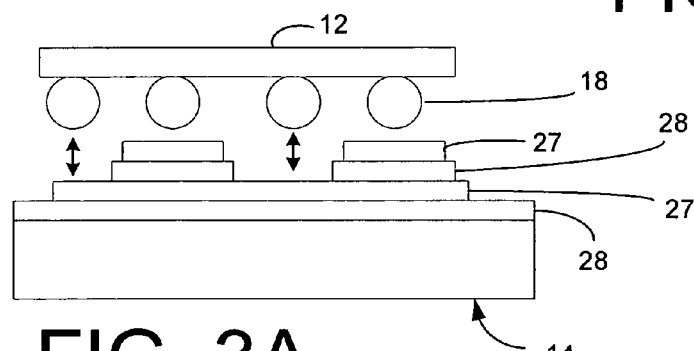
FIG. 3A shows an interface of an intermediate substrate to a semiconductor chip.

Shown in FIG. 3A is an expanded view of the interface of the intermediate substrate 14 to the semiconductor chip 12 via the conductive bumps 18. The intermediate substrate 14 may include several metalization layers 27 separated by insulation layers 35. The conductive bumps 18 are aligned with the metalization layers 27 to provide an electrical connection between the intermediate substrate 14 and the semiconductor chip 12. The metalization layers 27 and insulation layers 35 may be configured to form local decoupling capacitors.

Figure 3B:
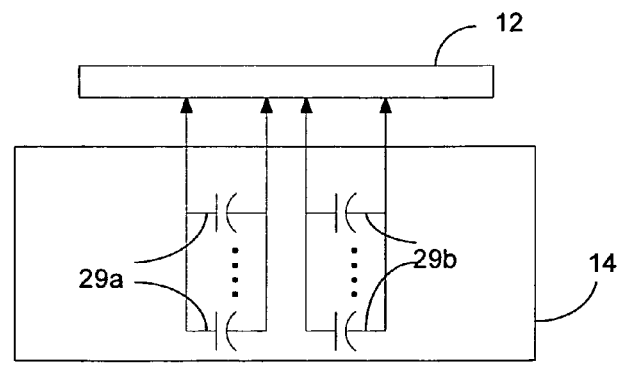
FIG. 3B shows an equivalent circuit diagram of an interface of an intermediate substrate to a semiconductor chip.

Shown in FIG. 3B is a circuit diagram illustrating the interface shown in FIG. 3A. Capacitors 29a and 29b represent the capacitance formed between the metalization layers 27.

Figure 4:
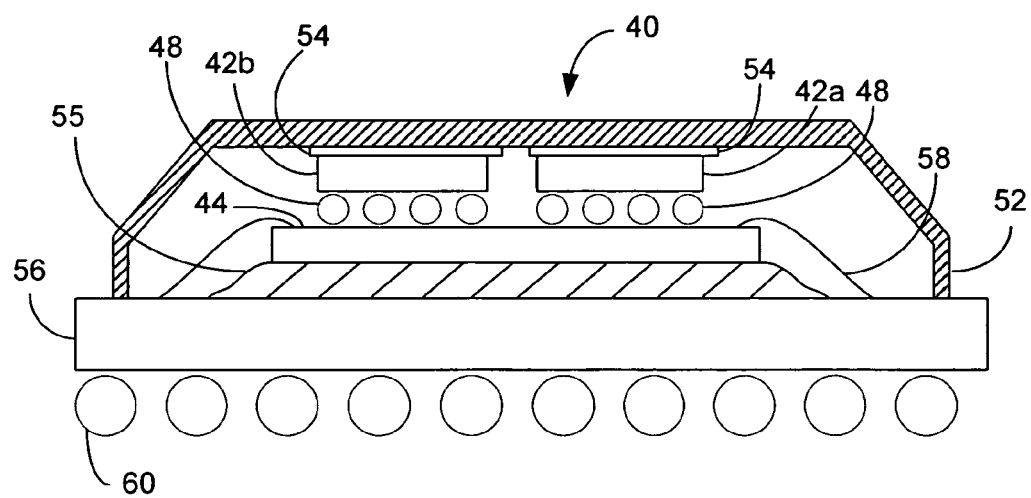
FIG. 4 shows an embodiment of an intermediate substrate.

Shown in FIG. 4 is a second embodiment of an integrated chip package 40 in accordance with the principles of the invention is shown. The integrated chip package 40 is similar in function to the integrated chip package 10, with corresponding elements numbered in the range 40-60, except that the integrated chip package 40 includes several semiconductor chips 42a and 42b attached to each intermediate substrate 44 to form a multichip module (MCM). In this embodiment, semiconductor chip 42a may be a logic circuit and semiconductor chip 42b may be a power device. Any combination of semiconductor chips 42 may be used including all logic devices, all power devices, or a mix of logic devices and power devices. In addition, the quantity of semiconductor chips that may be mounted within the integrated chip package 40 is not limited to merely two. The intermediate substrate 44 may be used to provide interconnects within the semiconductor chips 42a and 42b, among the semiconductor chips 42a and 42b, and from the semiconductor chips 42a and 42b to the conductive bumps 60. Thousands of bonding wires may be provided between the intermediate substrate 14 and the package substrate 56 for very low cost. Since many of the interconnects between the semiconductor chips 42a and 42b are made on the intermediate substrate 44, the quantity of bonding wire interconnects within the integrated chip package 40 may be significantly reduced. This is particularly advantageous with system on a package (SOP), where the power dissipation of devices within the package 40 exceeds 20 watts.

Figure 5:
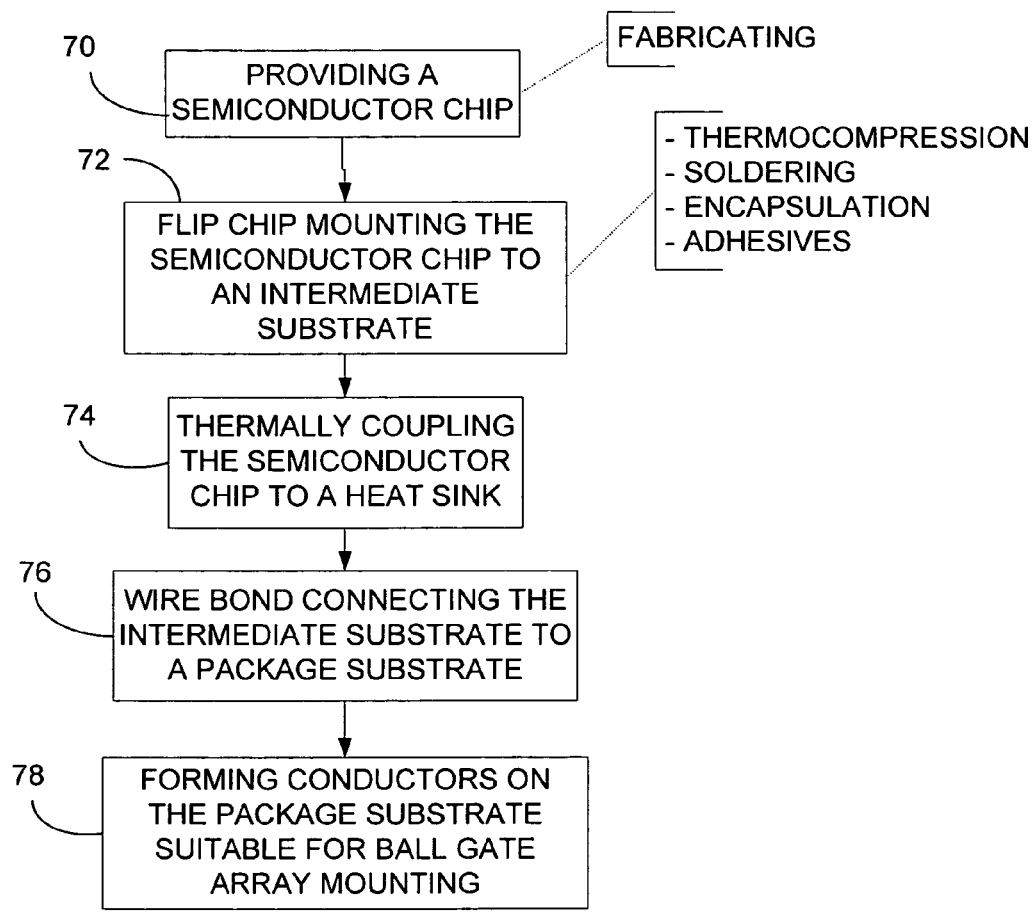
FIG. 5 shows a method of manufacturing an integrated chip package in accordance with the principles of the invention.

Shown in FIG. 5 is a method of manufacturing an integrated chip package 10 in accordance with the principles of the invention. At block 70 a semiconductor chip to be packaged is provided. The semiconductor chip is flip chip mounted to an intermediate substrate, block 72. The semiconductor chip is then thermally attached to a heat sink, block 74. At block 76, bonding wires are connected between the intermediate substrate and a package substrate. At block 78, conductors that are suitable for ball gate array mounting are formed on the package substrate.

Figure 6:
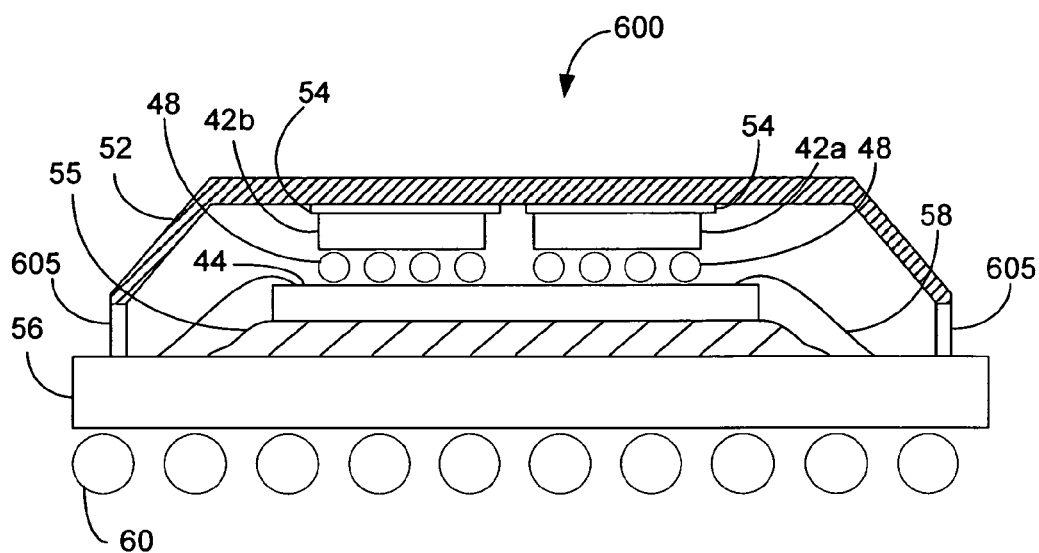
FIG. 6 shows an alternative embodiment of an integrated chip package in accordance with the principles of the invention.

Referring to FIG. 6, an alternative embodiment of an integrated chip package 600 in accordance with the principles of the invention is shown. According to the alternative exemplary embodiment, the heat sink 52 is substantially thermally isolated from the package substrate 56. For purposes of illustration and not limitation, thermal isolation members 605 can be used to thermally isolate the heat sink 52 from the package substrate 56. Each of the thermal isolation members 605 can be made of any suitable material that is capable of thermally isolating the heat sink 52 from the package substrate 56 or otherwise substantially blocking or preventing the transfer of heat from the heat sink to the package substrate 56.

A number of embodiments of the invention have been described. It is expressly intended that the foregoing description and accompanying drawings are illustrative of preferred embodiments only, not limiting, and that the true spirit and scope of the present invention will be determined by reference to the appended claims and their legal equivalent. It will be equally apparent and is contemplated that various modifications and/or changes may be made in the illustrated embodiments without departure from the spirit and scope of the invention. For example, the steps of the method of manufacturing may be performed in numerous different sequences. Accordingly, other embodiments are within the scope of the following claims.

What is claimed is:

1. An integrated chip package, comprising:
a plurality of semiconductor chips, wherein each of the plurality of semiconductor chips comprises (i) a first surface, and (ii) first conductive bumps;
an intermediate substrate configured to electrically connect to the first surfaces of the plurality of semiconductor chips via the first conductive bumps of the plurality of semiconductor chips, wherein
the intermediate substrate is configured to convert flip chip mounting of the plurality of semiconductor chips to wire bond mounting of the plurality of semiconductor chips,
the intermediate substrate includes (i) only non-active devices, (ii) a first layer, and (iii) a plurality of wires, and
the first layer of the intermediate substrate is configured to connect a first plurality of the first conductive bumps of the plurality of semiconductor chips to a first wire of the plurality of wires, wherein the first wire of the plurality of wires is at (i) a voltage potential of a power supply, or (ii) a ground potential; and
a package substrate comprising (i) a first surface configured to electrically connect to the intermediate substrate via the plurality of wires, (ii) second conductive bumps, and (iii) a second surface electrically connected to a printed circuit board via the second conductive bumps.

2. The integrated chip package of claim 1, wherein:
each of the plurality of semiconductor chips comprises a second surface; and
the second surfaces of the plurality of semiconductor chips are adhesively bonded to a single heat sink.

3. The integrated chip package of claim 2, wherein:
the heat sink is thermally isolated from the package substrate; and
the plurality of semiconductor chips and the intermediate substrate are disposed in the heat sink and between the heat sink and the package substrate.

4. The integrated chip package of claim 1, wherein the intermediate substrate comprises a material selected from a group consisting of silicon, polysilicon, and glass.

5. The integrated chip package of claim 1, further comprising a support layer arranged between the package substrate and the intermediate substrate and configured to support the intermediate substrate.

6. The integrated chip package of claim 1, further comprising:
metallization layers arranged on the intermediate substrate; and
an insulation layer arranged between the metallization layers,
wherein the metallization layers and the insulation layer collectively provide the decoupling capacitor.

7. The integrated chip package of claim 1, wherein the plurality of semiconductor chips do not include (i) a layer configured to distribute the voltage potential of the power supply within the plurality of semiconductor chips, and (ii) a layer configured to distribute the ground potential within the plurality of semiconductor chips.

8. The integrated chip package of claim 1, wherein:
the intermediate substrate comprises interconnects;
each of the interconnects is configured to connect to two of the first conductive bumps of the plurality of semiconductor chips; and
the first conductive bumps of the plurality of semiconductor chips, which are connected to the interconnects, are not at (i) the voltage potential of the power supply or (ii) the ground potential.

9. The integrated chip package of claim 1, wherein:
the first wire of the plurality of wires is at the voltage potential of the power supply;
the intermediate substrate comprises a second layer;
the second layer is configured to connect a second plurality of the first conductive bumps of the plurality of semiconductor chips to a second wire of the plurality of wires; and
the second wire of the plurality of wires is at the ground potential.

10. The integrated chip package of claim 1, wherein the intermediate substrate distributes the voltage potential of the power supply and the ground potential to a plurality of devices within the plurality of semiconductor chips.

11. The integrated chip package of claim 1, wherein:
the intermediate substrate comprises a decoupling capacitor; and
the decoupling capacitor is configured to (i) electrically connect to one of the plurality of semiconductor chips, and (ii) filter signals sent between the one of the plurality of semiconductor chips and the intermediate substrate.

12. The integrated chip package of claim 11, wherein the decoupling capacitor includes a trench capacitor.

13. The integrated chip package of claim 12, wherein the trench capacitor comprises a dielectric selected from a group consisting of nitride oxide and oxide.

14. The integrated chip package of claim 11, wherein the decoupling capacitor is configured to connect between (i) the first conductive bumps of the plurality of semiconductor chips, and (ii) the intermediate substrate.

15. The integrated chip package of claim 11, wherein the decoupling capacitor is configured to directly connect to one of the first conductive bumps of the plurality of semiconductor chips.

16. A circuit comprising:
the integrated chip package of claim 1;
the printed circuit board; and
a second integrated chip package mounted on the printed circuit board.

17. An integrated chip package comprising:
a semiconductor chip comprising (i) a first surface, and (ii) first conductive bumps;
an intermediate substrate configured to electrically connect to the first surface via the first conductive bumps, wherein
the intermediate substrate is configured to convert flip chip mounting of the semiconductor chip to wire bond mounting of the semiconductor chip,
the intermediate substrate comprises (i) only non-active devices, (ii) a first layer, and (iii) a plurality of wires, and
the first layer of the intermediate substrate is configured to connect a first plurality of the first conductive bumps to a first wire of the plurality of wires, wherein the first wire of the plurality of wires is at (i) a voltage potential of a power supply, or (ii) a ground potential; and
a package substrate comprising (i) a first surface electrically connected to the intermediate substrate via the plurality of wires, (ii) second conductive bumps, and (iii) a second surface electrically connected to a printed circuit board via the second conductive bumps.

18. The integrated chip package of claim 17, wherein the intermediate substrate is configured to directly connect the first conductive bumps of the semiconductor chip to the plurality of wires.

19. The integrated chip package of claim 17, wherein:
the intermediate substrate includes a decoupling capacitor;
the decoupling capacitor is configured to connect to the semiconductor chip; and
the semiconductor chip is configured to (i) directly connect to the first conductive bumps of the semiconductor chip, and (ii) filter signals transmitted between the semiconductor chip and the intermediate substrate.

20. The integrate chip package of claim 17, wherein:
the first wire of the plurality of wires is at the voltage potential of the power supply;
the intermediate substrate comprises a second layer configured to connect a second plurality of the first conductive bumps to a second wire of the plurality of wires; and
the second wire of the plurality of wires is at the ground potential.

21. The integrated chip package of claim 17, further comprising:
metallization layers arranged between the semiconductor chip and the intermediate substrate; and
an insulation layer arranged between the metallization layers,
wherein the metallization layers and the insulation layer collectively provide a decoupling capacitor.

* * * * *